United States Patent
Han

(10) Patent No.: US 9,401,440 B2
(45) Date of Patent: Jul. 26, 2016

(54) SOLAR CELL AND METHOD OF FABRICATING THE SAME

(71) Applicant: Seung Heon Han, Seoul (KR)

(72) Inventor: Seung Heon Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 15 days.

(21) Appl. No.: 14/354,467

(22) PCT Filed: Oct. 24, 2012

(86) PCT No.: PCT/KR2012/008743
§ 371 (c)(1),
(2) Date: Apr. 25, 2014

(87) PCT Pub. No.: WO2013/062298
PCT Pub. Date: May 2, 2013

(65) Prior Publication Data
US 2014/0261680 A1     Sep. 18, 2014

(30) Foreign Application Priority Data

Oct. 25, 2011    (KR) .................. 10-2011-0109156

(51) Int. Cl.
| | |
|---|---|
| *H01L 31/00* | (2006.01) |
| *H01L 31/0224* | (2006.01) |
| *H01L 31/0216* | (2014.01) |
| *H01L 31/05* | (2014.01) |
| *H01L 31/046* | (2014.01) |

(52) U.S. Cl.
CPC .. *H01L 31/022425* (2013.01); *H01L 31/02167* (2013.01); *H01L 31/046* (2014.12); *H01L 31/0512* (2013.01); *Y02E 10/50* (2013.01)

(58) Field of Classification Search
CPC .............. H01L 31/046; H01L 31/0463; H01L 31/0465; H01L 31/0468; H01L 31/0445
See application file for complete search history.

(56) References Cited

U.S. PATENT DOCUMENTS

| | | | | |
|---|---|---|---|---|
| 4,726,849 A | * | 2/1988 | Murata et al. | 136/244 |
| 4,872,925 A | * | 10/1989 | McMaster | 136/244 |
| 6,265,652 B1 | * | 7/2001 | Kurata et al. | 136/244 |
| 2006/0157105 A1 | * | 7/2006 | Nishi et al. | 136/263 |
| 2009/0032094 A1 | | 2/2009 | Aoki | |
| 2010/0282300 A1 | * | 11/2010 | Auvray | H01L 31/022425 136/252 |

FOREIGN PATENT DOCUMENTS

| | | |
|---|---|---|
| CN | 101375410 A | 2/2009 |
| JP | H0290574 A | 3/1990 |

(Continued)

OTHER PUBLICATIONS

International Search Report in International Application No. PCT/KR2012/008743, filed Oct. 24, 2012.
Office Action dated Mar. 29, 2013 in Korean Application No. 10-2011-0109156.

(Continued)

*Primary Examiner* — Eli Mekhlin
(74) *Attorney, Agent, or Firm* — Saliwanchik, Lloyd & Eisenschenk

(57) ABSTRACT

Disclosed are a solar cell, and a method of fabricating the same. The solar cell includes: a back electrode layer disposed on a support substrate; a light absorbing layer disposed on the back electrode layer; a front electrode layer disposed on the light absorbing layer; a connecting wire extending through the light absorbing layer and electronically connecting the back electrode layer with the front electrode layer; and a side insulating part formed on a side surface of the connecting wire.

5 Claims, 2 Drawing Sheets

(56) References Cited

FOREIGN PATENT DOCUMENTS

| | | |
|---|---|---|
| JP | 2648698 B2 | 9/1997 |
| JP | 2002-094089 A | 3/2002 |
| JP | 2011-018683 A | 1/2011 |
| KR | 10-2011-0060162 A | 6/2011 |
| KR | 10-2011-0098451 A | 9/2011 |

OTHER PUBLICATIONS

Chinese Office Action dated Sep. 22, 2015 in Chinese Application No. 201280064564.0.

Office Action dated Jun. 2, 2016 in Chinese Application No. 201280064564.0.

* cited by examiner

SOLAR CELL AND METHOD OF FABRICATING THE SAME

CROSS-REFERENCE TO RELATED APPLICATIONS

This application is the U.S. national stage application of International Patent Application No. PCT/KR2012/008743, filed Oct. 24, 2012, which claims priority to Korean Application No. 10-2011-0109156, filed Oct. 25, 2011, the disclosures of each of which are incorporated herein by reference in their entirety.

TECHNICAL FIELD

The embodiment relates a solar cell and a method of fabricating the same.

BACKGROUND ART

A solar cell may be defined as a device for converting light energy into electric energy by using a photovoltaic effect where electrons are produced by exposing a p-n junction diode to light. Such solar cells may be classified into a silicon solar cell, a compound semiconductor solar cell including group I-III-VI or group III-V, a dye-sensitized solar cell, and an organic solar cell according to a material used as a junction diode.

A solar cell made from CIGS (CuInGaSe), which is one of group I-III-VI Chal-copyrite-based compound semiconductors, represents superior light absorption, higher photoelectric conversion efficiency with a thin thickness, and superior electro-optic stability, so the CIGS solar cell is spotlighted as a substitute for a conventional silicon solar cell.

Different from a bulk solar cell, the CIGS thin film solar cell includes a plurality of unit cells, which are connected with each other in series through patterning processes (TH1 to TH3). The most important patterning process is the TH2 process. A connection wire makes contact with the back electrode at the TH2 pattern, so electric loss may occur and the efficiency of the solar cell may be significantly degraded if the contact fails at the TH2 pattern.

DISCLOSURE OF INVENTION

Technical Problem

The embodiment provides a solar cell having a reduced leakage current, an improved reliability, and an enhanced photoelectric conversion efficiency, and a method of manufacturing the same.

Solution to Problem

According to the first embodiment, there is provided a solar cell including: a back electrode layer disposed on a support substrate; a light absorbing layer disposed on the back electrode layer; a front electrode layer disposed on the light absorbing layer; a connecting wire formed through the light absorbing layer and electrically connecting the back electrode layer and the front electrode layer; and a side insulating part formed on a side surface of the connecting wire.

According to the second embodiment, there is provided a solar cell including: a back electrode layer disposed on a support substrate and having a first groove partially exposing the support substrate; a first side insulating part formed on a side surface of the back electrode layer having the first groove; a light absorbing layer disposed on the back electrode layer and a second groove partially exposing the back electrode layer; a connecting wire gap-filled in the second groove; a second side insulating part gap-filled in the second groove and formed on a side surface of the connecting wire; and a front electrode layer disposed on the light absorbing layer.

According to the embodiment, there is provided a method of fabricating a solar cell, the method including: forming a back electrode layer on a support substrate; forming a light absorbing layer on the back electrode layer; forming a groove through the light absorbing layer; forming a side insulating part on a side surface of the groove; and forming a connecting wire and a front electrode layer on the light absorbing layer.

Advantageous Effects of Invention

According to the first embodiment, since a second insulating part is formed on a side surface of a connecting wire, leakage currents flowing from the connecting wire to a light absorbing layer are reduced, and accordingly, a reliability of a device is improved.

According to the second embodiment, since a first side insulating part is formed on a side surface of a first groove formed such that a support substrate is partially exposed, leakage currents flowing between back electrode layers spaced by a first groove can be reduced, and accordingly, a reliability of a device is improved.

In addition, since leakage currents can be prevented by the side insulating parts, a width of the grooves can become narrower, increasing a volume of the light absorbing layer. Accordingly, the photoelectric conversion efficiency can be improved.

According to the method of fabricating a solar cell of the embodiment, grooves and side insulating parts can be formed simultaneously by using a scribing tip having a hole. Accordingly, a side insulating part can be formed through a simple method without performing a separate process.

MODE FOR THE INVENTION

Figure 1:
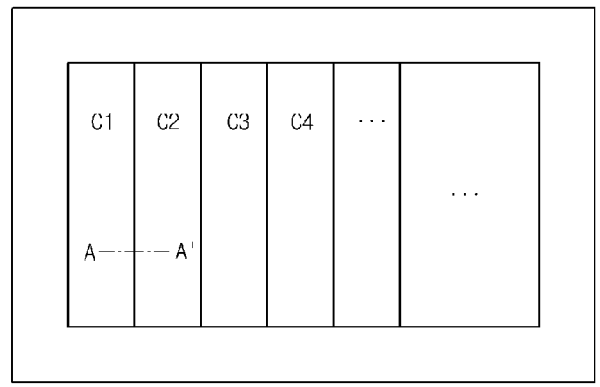
FIG. 1 is a plan view illustrating a solar cell according to the first embodiment.

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

Figure 2:
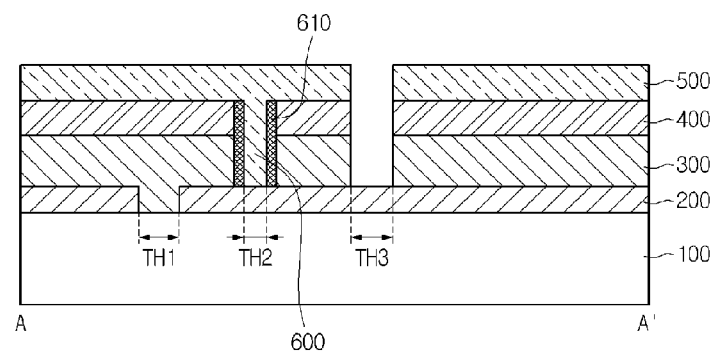
FIG. 2 is a sectional view taken along line A-A' of FIG. 1.

FIG. 1 is a plan view illustrating a solar cell according to the first embodiment. FIG. 2 is a sectional view taken along line A-A' of FIG. 1.

Referring to FIGS. 1 and 2, the solar cell according to the first embodiment includes a support substrate 100, a back electrode layer 200, a light absorbing layer 300, a buffer layer 400, a front electrode layer 500, a connecting wire 600, and a side insulating part 610.

The support substrate 100 has a plate shape, and supports the back electrode layer 200, the light absorbing layer 300, the buffer layer 400, the front electrode layer 500, the connecting wire 600, and the side insulating part 610.

The support substrate 100 may be an insulator. The support substrate 100 may be a glass substrate, a plastic substrate, or a metal substrate. In more detail, the support substrate 100 may be a soda lime glass substrate. The support substrate 100 may be transparent. The support substrate 100 may be rigid or flexible.

The back electrode layer 200 is a conductive layer. The back electrode layer 200 may be formed of one of molybdenum (Mo), gold (Au), aluminum (Al), chrome (Cr), tungsten (W), and copper (Cu). Among the above materials, the Mo represents a thermal expansion coefficient similar to that of the support substrate 100, so the Mo may improve the adhesive property, prevent the back electrode layer 200 from being delaminated from the support substrate 100, and sufficiently satisfy the characteristics required by the back electrode layer 200.

First grooves TH1 may be formed in the back electrode layer 200. The first grooves TH1 correspond to open areas for exposing an upper surface of the support substrate 100. When viewed from the top, the first grooves TH1 may extend in one direction. A width of the first grooves TH1 may be approximately 50 μm to 100 μm.

The light absorbing layer 300 is disposed on the back electrode layer 200. A material contained in the light absorbing material 300 is gap-filled in the first grooves TH1.

The light absorbing layer 300 includes group I-III-VI compounds. For example, the light absorbing layer 300 may have a copper-indium-gallium-selenium-based $(Cu(In,Ga)(Se,S)_2$; CIGSS-based) crystalline structure, a copper-indium-selenium-based or copper-gallium-selenium-based crystalline structure. An energy band gap of the light absorbing layer 300 may be approximately 1 eV to 1.8 eV.

The second absorbing layer 300 may include second grooves TH2 for partially exposing the back electrode layer 200, and a plurality of light absorbing parts may be defined by the second grooves TH2. That is, the light absorbing layer 300 may be classified into the light absorbing parts by the second grooves TH2.

The second grooves TH2 are formed adjacent to the first grooves TH1. That is, when viewed from the top, some of the second grooves TH2 are formed near the first grooves TH1. A width of the second grooves TH2 may be approximately 40 μm to 150 μm, but the embodiment is not limited thereto.

The connecting wire 600 and the side insulating part 610 may be formed in the second grooves TH2. This structure will be described in detail together with the connecting wire 600 below.

The buffer layer 400 is disposed on the light absorbing layer 300. In the solar cell according to the embodiment, a pn junction is formed between the light absorbing layer 300 corresponding to a CIGS or CIGSS compound thin film which is a p-type semiconductor and a thin film of the front electrode layer 500 which is an n-type semi-conductor. However, differences between lattice constants and band gap energy between the two materials are large, and thus a buffer layer by which a band gap is located between the two materials is necessary to form an excellent junction. The buffer layer 400 includes cadmium sulfide (CdS), and an energy band gap of the buffer layer 400 is approximately 2.2 eV to 2.4 eV.

Meanwhile, although not illustrated in the drawings, a high-resistance buffer layer (not illustrated) may be additionally disposed on the buffer layer 400. The high-resistance buffer layer includes zinc oxide (i-ZnO) which is not doped with impurities.

The front electrode layer 500 is disposed on the buffer layer 400. The front electrode layer 500 is transparent, and is a conductive layer. The front conductive layer 500 may include an oxide. For example, the front electrode layer 500 may include zinc oxide, indium tin oxide (ITO), or indium zinc oxide (IZO). The oxide may include conductive impurities such as aluminum (Al), alumina ($Al_2O_3$), magnesium (Mg), or gallium (Ga). In more detail, the front electrode layer 500 may include Al doped zinc oxide (AZO) or Ga doped zinc oxide (GZO).

The connecting wire 600 is integrally formed with the front electrode layer 500. That is, the connecting wire 600 may be formed simultaneously when the front electrode layer 500 is formed, and a material of the connecting wire 600 is the same as a material of the front electrode layer 500.

The connecting wire 600 is disposed in the second grooves TH2. That is, the connecting wire 600 extends through the light absorbing layer 300.

The connecting wire 600 extends downward from the front electrode layer 500 and is connected to the back electrode layer 200. That is, the connecting wire 600 may electrically connect the front electrode layer 500 and the back electrode layer 200.

For example, the connecting wire 600 extends from a front electrode of a first cell C1, and is connected to a back electrode of a second cell C2 adjacent to the first cell C1. Thus, the connecting wire 600 connects adjacent cells. In more detail, the connecting wire 600 connects windows and back electrodes included in the adjacent cells C1, C2, . . . so that a current flows.

The side insulating part 610 is disposed on a side surface of the connecting wire 600. In more detail, the side insulating part 610 may be disposed on both side surfaces of the connecting wire 600.

The side insulating part 610 is an area a resistance of which is higher than that of the connecting wire 600, and may prevent electrons in the connecting wire 600 from flowing to the light absorbing layer 300. That is, the solar cell according to the first embodiment can reduce leakage of currents with the side insulating part 610.

Any material having a resistance higher than that of the connecting wire 600 may be used as a material of the side insulating part 610 without being specifically limited. In more detail, the side insulating part 610 may include a metal oxide layer, an inorganic oxide layer, or a polymer insulating layer. Further, a width of the side insulating part 610 may be approximately 1 μm to 10 μm, but the embodiment is not limited thereto.

The side insulating part 610 is gap-filled in grooves, for example, the second grooves TH2 to be formed. That is, the side insulating part 610 is gap-filled in the second grooves TH2 to be formed together with the connecting wire 600. For example, the side insulating part 610 may formed between a side surface of the light absorbing layer 300 exposed through the second grooves TH2 and a side surface of the connecting wire 600. Accordingly, the side insulating part 610 may make direct contact with a portion of the back electrode layer exposed by the second grooves TH2.

Figure 3:
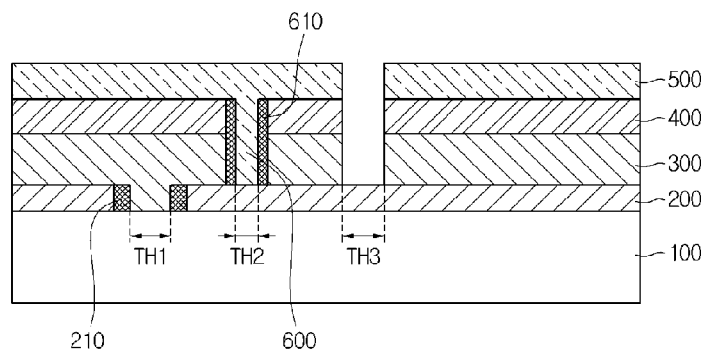
FIG. 3 is a sectional view of a solar cell according to the second embodiment.

FIG. 3 is a sectional view of a solar cell according to the second embodiment. A description of the solar cell according to the second embodiment will be made with reference to the description of the solar cell according to the first embodiment.

The solar cell according to the second embodiment may further include a first side insulating part 210 on a side surface of the back electrode layer 200 spaced by the first grooves TH1.

The first side insulating part 210 can prevent electrons from flowing to the light absorbing layer 300 burying the first grooves TH1. That is, the first side insulating part 210 is an area a resistance of which is higher than that of the light absorbing layer 300, the first side insulating part 210 may be formed by oxidizing the back electrode layer 200 or by coating a polymer compound (for example, Poly Methyl Methacrylate (PMMA)) having a high resistance. Further, since leakage of currents can be prevented by the first side insulating part 210, a width of the first grooves TH1 may become narrower, increasing a volume of the light absorbing layer 300.

In FIG. 3, the first side insulating part 210 may be on a side surface of the back electrode layer 200, and a portion thereof may be formed on an upper surface of the back electrode layer 200. Further, the first side insulating part 210 may has a width of approximately 1 μm to 10 μm.

FIGS. 4 to 9 are sectional views illustrating a method of fabricating a solar cell according to an embodiment. A description of the fabricating method will be made with reference to the description of the solar cells according to the first and second embodiments.

Figure 4:
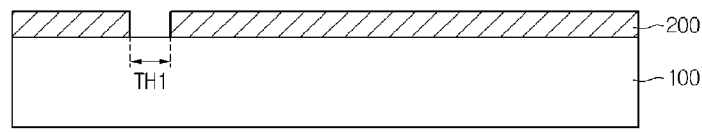
FIGS. 4 to 9 are sectional views illustrating a method of fabricating a solar cell according to an embodiment.

Referring to FIG. 4, the back electrode layer 200 is formed on the support substrate 100, and the back electrode layer 200 is pattern so that the first grooves TH1 are formed. Accordingly, a plurality of back electrodes is formed on the support substrate 100. The back electrode layer 200 may be patterned by laser, but the embodiment is not limited thereto.

Meanwhile, although not illustrated, after the first grooves TH1 are formed, the first side insulating parts 210 may be formed on a side surface of the first grooves TH1. Further, a portion of the first side insulating part 210 may be formed on an upper surface of the back electrode layer 200.

The first side insulating part 210 may be formed by oxidizing the back electrode layer 200. In more detail, the first grooves TH1 are patterned by laser, and heat of a high temperature is generated in the process. Thereafter, the side insulating part 210 may be formed by oxidizing a side surface of the patterned back electrode layer 200 by using oxygen. On the other hand, the first side insulating part 210 may be formed by coating a polymer compound having a high resistance.

Since the first side insulating part 210 has a very low electrical conductivity, leakage currents flowing between the back electrode layer 200 spaced by the first grooves TH1 can be reduced while improving reliability of a device.

Figure 5:
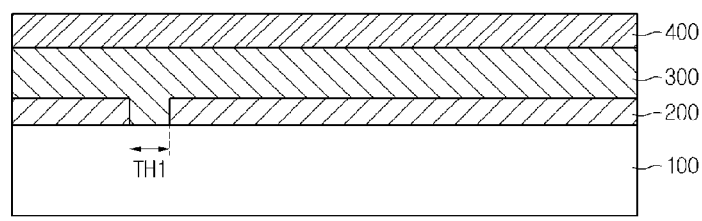

Referring to FIG. 5, the light absorbing layer 300 is formed on the back electrode layer 200. The light absorbing layer 300 may be formed through sputtering or evaporation.

For example, in order to form the light absorbing layer 300, a method of forming a copper-indium-gallium-selenium-based ($Cu(In,Ga)(Se)_2$; CIGS-based) light absorbing layer 300 while simultaneously or separately evaporating copper, indium, gallium, and selenium and a method for performing a selenization process after a metallic precursor layer has been formed are widely used.

Regarding the details of the selenization process after the formation of the metallic precursor layer, the metallic precursor layer is formed on the back electrode layer 200 through a sputtering process employing a Cu target, an In target, and a Ga target. Thereafter, the metallic precursor layer is subject to the selenization process so that the Cu (In, Ga) $Se_2$ (GIGS) based light absorbing layer 300 is formed.

As an alternative, the sputter process and the selenization process using the copper target, the indium target, and the gallium target may be performed at the same time.

As another alternative, a CIS-based or CIG-based light absorbing layer 300 may be formed through a sputtering process or a selenization process by using only a copper target or an indium target, or by using a copper target and a gallium target.

Next, the buffer layer 400 is formed on the light absorbing layer 300. The buffer layer 400 may be formed, for example, through physical vapor deposition (PVD) or metal-organic chemical vapor deposition (MOCVD).

Figure 6:
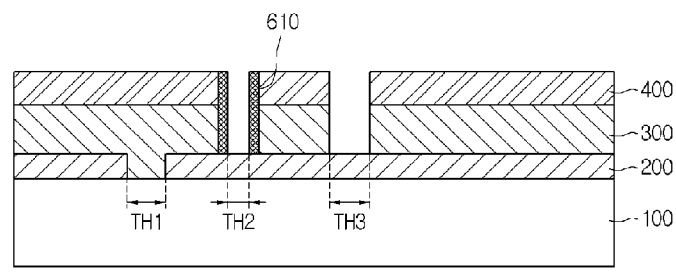
Figure 7:
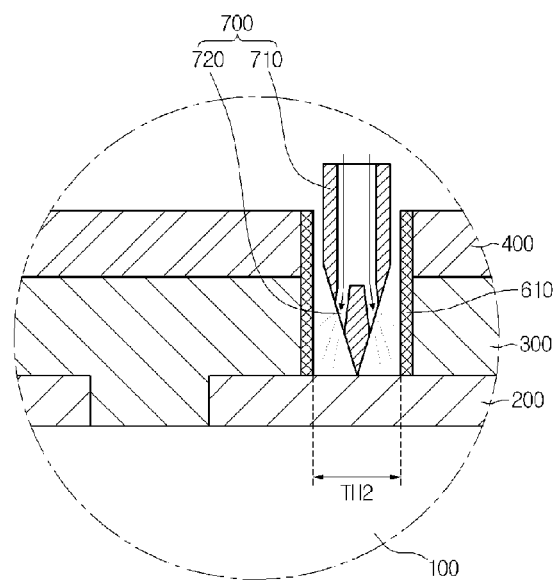

Referring to FIGS. 6 and 7, the second grooves TH2 are formed by partially removing the light absorbing layer 300 and the buffer layer 400, and the side insulating part 610 is formed on a side wall of the second grooves TH2.

The second grooves TH2 and the side insulating parts 610 may be formed at the same time. In more detail, the second grooves TH2 may be formed by a scribing tip 700 having an injection hole 720 as illustrated in FIG. 7. The scribing tip 700 may have a body 710 and injection holes 720 formed at both sides of the body 710. A lower surface of the body 710 may be formed to be sharp downward, and the second grooves TH2 may be formed on a lower surface of the body 710 by partially scraping the light absorbing layer 300.

The injection holes 720 may be formed through an upper portion and a lower portion of the body 710. A supply unit (not illustrated) in which an insulating part forming material is stored is connected to upper portions of the injection holes 720. The insulating part forming material may include liquid, vapor, or paste. That is, the insulating part forming material may be injected to side walls of the second grooves T2 through the injection holes, and accordingly, the side insulating part 610 is formed on side walls of the second grooves TH2 to have a predetermined thickness.

Until now, it has been described that the second grooves TH2 are formed in the light absorbing layer 300 and the side insulating part 610 is formed by injecting the insulating part forming material, but the embodiment is not limited thereto. That is, in the method of fabricating the solar cell according to the embodiment, the second grooves TH2 and the side insulating part 610 may be sequentially formed, but the embodiment is not limited thereto. For example, after the second grooves TH2 are formed first in the light absorbing layer 300 by the scribing tip 700, the scribing tip 700 may be moved again at a predetermined speed so that the insulating part forming material can be injected separately.

A width of the second groves TH2 formed through the process may be approximately 40 μm to 150 μm. Further, the second grooves TH2 are formed to partially expose an upper surface of the back electrode layer 200.

Figure 8:
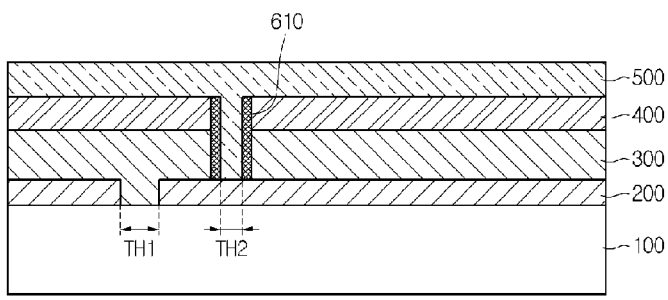

Referring to FIG. 8, a transparent conductive material is deposited on the front electrode layer 400 to form the front electrode layer 500.

At the same time, a transparent conductive material is also deposited at inner sides of the second grooves TH2 so that the connecting wire 600 is formed. That is, the connecting wire 600 may be formed by gap-filling the transparent conductive material in the second grooves TH2. In more detail, the connecting wire 600 may be gap-filled in the side insulating parts 610 of the second grooves TH2.

The front electrode layer 500 and the connecting wire 600 may be formed by depositing the transparent conductive material in an oxygen-free atmosphere. In more detail, the front electrode layer 500 may be formed by depositing aluminum doped zinc oxide in an inert gas atmosphere where oxygen is not contained.

Figure 9:
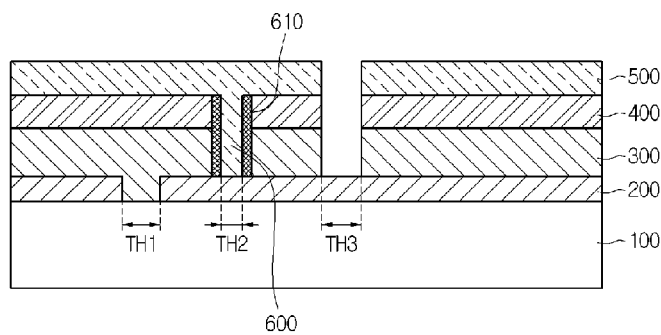

Referring to FIG. 9, the third grooves TH3 are formed by partially removing the light absorbing layer 300, the buffer layer 400, and the front electrode layer 500. Accordingly, the front electrode layer 500 is patterned to define a plurality of windows and a plurality of cells C1, C2, . . . . A width of the third grooves TH3 may be approximately 40 μm to 150 μm. In this way, the method of fabricating a solar cell according to the embodiment provides a solar cell including a first side insulating part 210 formed on a side surface of a first groove TH1 and a side insulating part 610 formed on a side surface of the connecting wire 600. The first side insulating part 210 and the side insulating part 710 reduce leakage currents flowing to the back electrode layer 200 and the light absorbing layer 300, thereby improving reliability of a device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
a back electrode layer disposed on a support substrate and having a first groove partially exposing the support substrate;
a first side insulating part formed on a side surface of the back electrode layer;
a light absorbing layer disposed on the back electrode layer and having a second groove partially exposing the back electrode layer;
a front electrode layer on the light absorbing layer;
a connecting wire extending through the light absorbing layer and electrically connecting the back electrode layer with the front electrode; and
a second side insulating part on a side surface of the connecting wire;
wherein the connecting wire and the second side insulating part fill space of the second groove;
wherein the connecting wire is integrally formed with the front electrode layer and material of the connecting wire is same as material of the front electrode layer; and
wherein the first side insulating part includes an oxidized material of the back electrode layer and is positioned between the side surface of the back electrode layer and the connecting wire.

2. The solar cell of claim 1, wherein the second side insulating part is formed between a side surface of the light absorbing layer and the side surface of the connecting wire.

3. The solar cell of claim 1, wherein a buffer layer is disposed on the light absorbing layer and the second groove extends into the buffer layer.

4. The solar cell of claim 1, wherein the connecting wire extends downward from the front electrode layer.

5. The solar cell of claim 1, wherein a width of the first side insulating part and a width of the second side insulating part each is in a range of 1 μm to 10 μm.

* * * * *